(12) United States Patent
Wang et al.

(10) Patent No.: US 9,437,435 B2
(45) Date of Patent: Sep. 6, 2016

(54) LTPS TFT HAVING DUAL GATE STRUCTURE AND METHOD FOR FORMING LTPS TFT

(71) Applicant: SHENZHEN CHINA STAR OPTOELECTRONICS TECHNOLOGY CO., LTD, Shenzhen (CN)

(72) Inventors: Xiaoxiao Wang, Shenzhen (CN); Hsiang Chih Hsiao, Shenzhen (CN); Peng Du, Shenzhen (CN); Chang-I Su, Shenzhen (CN); Hongyuan Xu, Shenzhen (CN); Bo Sun, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 27 days.

(21) Appl. No.: 14/415,607

(22) PCT Filed: Nov. 14, 2014

(86) PCT No.: PCT/CN2014/091057
§ 371 (c)(1),
(2) Date: Jan. 19, 2015

(87) PCT Pub. No.: WO2016/074204
PCT Pub. Date: May 19, 2016

(65) Prior Publication Data
US 2016/0133473 A1    May 12, 2016

(30) Foreign Application Priority Data

Nov. 11, 2014 (CN) .......................... 2014 1 0631072

(51) Int. Cl.
*H01L 21/28* (2006.01)
*H01L 27/12* (2006.01)
(Continued)

(52) U.S. Cl.
CPC ... *H01L 21/28114* (2013.01); *H01L 21/28035* (2013.01); *H01L 27/1222* (2013.01);
(Continued)

(58) Field of Classification Search
CPC .................... H01L 29/66757; H01L 27/1214; H01L 29/78621; H01L 27/12; H01L 27/1288; H01L 29/4908
USPC ....... 257/E21.413, 72, E27.111, E29.278, 40
See application file for complete search history.

(56) References Cited

U.S. PATENT DOCUMENTS 5,354,700 A * 10/1994 Huang .............. H01L 29/66742
148/DIG. 150
6,639,246 B2 * 10/2003 Honda ................ H01L 29/6675
257/347

(Continued)

*Primary Examiner* — David Vu
*Assistant Examiner* — Jonathan Han
(74) *Attorney, Agent, or Firm* — Mark M. Friedman

(57) ABSTRACT

The present invention proposes a low temperature poly-silicon thin-film transistor having a dual-gate structure and a method for forming the low temperature poly-silicon thin-film transistor. The low temperature poly-silicon thin-film transistor includes: a substrate, one or more patterned amorphous silicon (a-Si) layers, disposed in a barrier layer on the substrate, for forming a bottom gate, an NMOS disposed on the barrier layer, and a PMOS disposed on the barrier layer. The NMOS comprises a patterned gate electrode (GE) layer as a top gate, and the patterned GE layer and the bottom gate formed by the one or more patterned a-Si layers form a dual-gate structure. The present invention proposes a low temperature poly-silicon thin-film transistor with a more stabilized I-V characteristic, better driving ability, low power consumption, and higher production yield.

2 Claims, 3 Drawing Sheets

(51) Int. Cl.
*H01L 29/786* (2006.01)
*H01L 29/66* (2006.01)
*H01L 29/49* (2006.01)
*H01L 29/423* (2006.01)

(52) U.S. Cl.
CPC ..... *H01L27/1288* (2013.01); *H01L 29/42384* (2013.01); *H01L 29/4908* (2013.01); *H01L 29/6675* (2013.01); *H01L 29/78672* (2013.01)

(56) References Cited

U.S. PATENT DOCUMENTS

| | | | |
|---|---|---|---|
| 6,740,938 B2 * | 5/2004 | Tsunoda | H01L 27/1214 257/352 |
| 7,759,178 B2 * | 7/2010 | Kim | H01L 27/1214 257/E29.151 |
| 8,237,228 B2 * | 8/2012 | Or-Bach | G03F 9/7076 257/369 |

* cited by examiner

LTPS TFT HAVING DUAL GATE STRUCTURE AND METHOD FOR FORMING LTPS TFT

BACKGROUND OF THE INVENTION

1. Field of the Invention

The present invention relates to the technological field of liquid crystal production, and more particularly, to a low temperature poly-silicon thin-film transistor (LTPS TFT) having a dual-gate structure and a method for forming the LTPS TFT.

2. Description of the Prior Art

Technology on LTPS TFTs has developed and advanced to a certain extent. Compared with amorphous silicon (often abbreviated a-si) and oxidation, LTPS TFTs have higher carrier mobility, which means that LTPS TFTs are good for enhancing the driving ability of devices and reducing power consumption of devices. Moreover, an LTPS TFT can be a part of a complementary metal oxide semiconductor (CMOS) circuit. The circuit reliability of a gate driver on array (GOA) which uses the CMOS circuit increases. In the manufacturing process of CMOSs, the doping of a lightly doped drain (LDD) of an N-type metal-oxide-semiconductor (NMOS) can be conducted through a single mask. Or, a lightly doped drain (LDD) of an N-type metal-oxide-semiconductor (NMOS) can be doped through the gate over wet etching. It is not necessary to use a mask in the latter manufacturing process of CMOSs, but the latter manufacturing process of CMOSs may have a poor yield rate.

A mainstream structure of the conventional LTPS TFT is famous for a top gate structure. Photo leakage current easily occurs on channels when a conventional LCD shows images without any shielding layers.

SUMMARY OF THE INVENTION

An object of the present invention is to provide an LTPS TFT having a dual-gate structure and a method for forming the LTPS TFT for solving a problem occurring in the conventional technology. The problem is that photo leakage current easily occurs on channels when the conventional LCDs shows images without any shielding layers.

In the present invention, a patterned GE layer is used as a top gate, and a patterned a-Si layer is used as a bottom gate. An LTPS TFT with the structure of a dual-gate (i.e., the top gate and the bottom gate) is formed.

An object of the present invention is to provide an LTPS TFT having a dual-gate structure for goals of stabilizing current-voltage characteristic (I-V characteristic) more effectively, improving breakover current more effectively, enhancing driving capability, and reducing power consumption. In addition, the conventional process of gate over wet etching is not used in the present invention. The elimination of the process of gate over wet etching obtains a higher yield rate.

According to a preferred embodiment of the present invention, a low temperature poly-silicon thin-film transistor (LTPS TFT) having a dual-gate structure comprises: a substrate; one or more patterned amorphous silicon (a-Si) layers, disposed in a barrier layer on the substrate, for forming a bottom gate; an N-type metal-oxide-semiconductor (NMOS) disposed on the barrier layer; and a P-type metal-oxide semiconductor (PMOS) disposed on the barrier layer. The NMOS comprises a patterned gate electrode (GE) layer as a top gate, and the patterned GE layer and the bottom gate fainted by the one or more patterned a-Si layers form a dual-gate structure.

In one aspect of the present invention, the NMOS comprises: a first patterned poly-silicon (poly-si) layer; two $N^-$-type layers, comprising an inner side connected to two outer sides of the first patterned poly-Si layer, respectively; two $N^+$-type layers, connected to two outer sides of the two $N^-$-type layers, respectively; and a gate insulation layer, disposed on the first patterned poly-Si layer, the two $N^-$-type layers, the two $N^+$-type layers, and the barrier layer.

In another aspect of the present invention, the PMOS comprises: a second patterned poly-Si layer; two $P^+$-type layers, connected to two outer sides of the second patterned poly-Si layer, respectively; and the gate insulation layer, disposed on the second patterned poly-Si layer and the two $P^+$-type layers.

In another aspect of the present invention, the gate insulation layer insulates and separates the patterned GE layer of the NMOS from the first patterned poly-Si layer for forming an N-type channel in the first patterned poly-Si layer.

In another aspect of the present invention, the PMOS comprises a patterned GE layer, and the gate insulation layer insulates and separates the patterned GE layer of the PMOS from the second patterned poly-Si layer so that the second patterned poly-Si layer forms a P-type channel.

In another aspect of the present invention, the LIPS TFT further comprises an inter-level dielectric (ILD) formed on the patterned GE layer and the gate insulation layer, and a plurality of via holes penetrating the ILD and the gate insulation layer.

In still another aspect of the present invention, the LTPS TFT further comprises a plurality of patterned source/drain electrodes, connected to the $P^+$-type layer of the PMOS and the $N^+$-type layer of the NMOS through the plurality of via holes, respectively.

In yet another aspect of the present invention, the patterned GE layer is made of a first metal and comprises a vertical extension connected to the $N^+$-type layer connected to the first patterned a-Si layer through the N-type channel to form the LTPS TFT having the dual-gate structure.

According to another preferred embodiment of the present invention, a method for forming an LTPS TFT having a dual-gate structure, comprises: forming a plurality of patterned a-Si layers disposed on a substrate; forming a barrier layer on the plurality of patterned a-Si layers; forming a first patterned poly-Si layer and a second patterned poly-Si layer on the barrier layer; coating a first photoresist layer on a top surface of the second patterned poly-Si layer and on a lateral side of the second patterned poly-Si layer; forming an N-type channel by doping the first patterned poly-Si layer; removing the first photoresist layer from the second patterned poly-Si layer; forming a gate insulation layer on both of the second patterned poly-Si layer and the first patterned poly-Si layer where the N-type channel is formed; forming a second photoresist layer on the gate insulation layer, and doping the second patterned poly-Si layer to form a $P^+$-type layer; removing the second photoresist layer from the gate insulation layer, and coating a third photoresist layer on the gate insulation layer; removing a part of the third photoresist layer, a part of the gate insulation layer, and a part of the barrier layer by performing exposing and developing processes, for forming a plurality of openings; $N^+$ doping a part of the patterned a-Si layer and a part of the first patterned poly-Si layer which are not covered by the gate insulation layer; forming a plurality of patterned GE layers on the gate insulation layer; $N^-$ doping the first patterned poly-Si layer and the second patterned poly-Si layer with the plurality of patterned GE layers as a second shielding layer, the plurality of patterned GE layers corresponding to the first patterned poly-Si layer connected to and conducted to the N$^+$-type layer of the patterned a-Si layer, and the plurality of patterned GE layers and the N$^+$-type layer forming a dual-gate structure; forming an ILD on the plurality of patterned GE layers and the gate insulation layer; forming a plurality of via holes penetrating the ILD and the gate insulation layer; and forming a plurality of patterned source/drain electrodes through the plurality of via holes, the plurality of patterned source/drain electrodes connected to the P$^+$-type layer which is connected to the second patterned poly-Si layer to form a PMOS, and the plurality of patterned source/drain electrodes connected to the N$^+$-type layer which is connected to the first patterned poly-Si layer to form an NMOS.

In another aspect of the present invention, the N$^+$-type layer is doped with the exposed part of the patterned a-Si layer for forming an ohmic contact with a metallic electrode. Any display device using any kind of technology can adopt the present invention. A display device in a medial or a smaller size is especially good for adopting the present invention. According to the present invention, the manufacturing process of the dual-gate TFT replaces the conventional manufacturing process of the poly-silicon (poly-si) TFT for enhancing charging capacity so that the size of the device can be made smaller and pixel aspect ratio (often abbreviated PAR) can increase. The CMOS circuit is formed with the manufacturing process and applies to the GOA. Compared with the GOA adopting the a-Si, the GOA adopting the CMOS has merits of optimizing circuit designs and enhancing reliability of the circuit.

These and other features, aspects and advantages of the present disclosure will become understood with reference to the following description, appended claims and accompanying figures.

DETAILED DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 9:
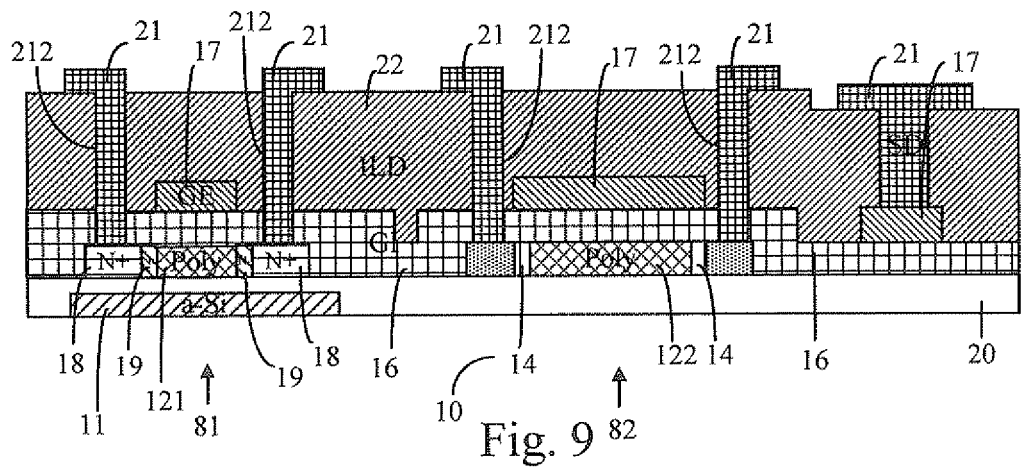
FIG. 9 is a diagram of a plurality of patterned source/drain electrodes formed by a second metallic layer, and the plurality of patterned source/drain electrodes connected to the P$^+$-type layer of the PMOS, and connected to the N$^+$-type layer of the NMOS through the via hole according to the preferred embodiment of the present embodiment.

Please refer to FIG. 9 showing an LTPS TFT having a dual-gate structure according to one preferred embodiment of the present invention. The LTPS TFT comprises a substrate 10, one or more patterned a-Si layers 11, an NMOS 81, and a PMOS 82. The one or more patterned a-Si layers 11 are disposed in a barrier layer 20 on the substrate 10. The one or more patterned a-Si layers 11 forms a bottom gate. The NMOS 81 is disposed on the barrier layer 20. The PMOS 82 is disposed on the barrier layer 20. The NMOS 81 comprises a patterned gate electrode (GE) layer 17. The patterned GE layer 17 is used as a top gate. The patterned GE layer 17 as the top gate and the one or more patterned a-Si layers 11 as the bottom gate form a dual-gate structure.

The NMOS 81 comprises a first patterned poly-Si layer 121, two N$^-$-type layers 19, two N$^+$-type layers 18, and a part of a gate insulation layer 16. The inner sides of the two N$^-$-type layers 19 are connected to the outer side of the first patterned poly-Si layer 121, respectively. The inner sides of the two N$^+$-type layers 18 are connected to two outer sides of the N$^-$-type layer 19, respectively. The gate insulation layer 16 is disposed on the first patterned poly-Si layer 121, the two N$^-$-type layers 19, the two N$^+$-type layers 18, and the barrier layer 20. The PMOS 82 comprises a second patterned poly-Si layer 122, two P$^+$-type layers 14, and a part of the gate insulation layer 16. The two P$^+$-type layers 14 are connected to two outer sides of the second patterned poly-Si layer 122, respectively. The gate insulation layer 16 is disposed on the second patterned poly-Si layer 122, the two P$^+$-type layers 14, and the barrier layer 20.

The gate insulation layer 16 insulates and separates the patterned GE layer 17 of the NMOS 81 from the first patterned poly-Si layer 121 for forming an N-type channel in the first patterned poly-Si layer 121.

The PMOS 82 comprises a patterned GE layer 17. The gate insulation layer 16 insulates and separates the patterned GE layer 17 of the PMOS 82 from the second patterned poly-Si layer 122 for forming a P-type channel in the second patterned poly-Si layer 122.

Please refer to FIG. 9. The LIPS TFT having the dual-gate structure further comprises an inter-level dielectric (ILD) 22, a plurality of via holes 212, and a plurality of patterned source/drain electrodes 21. The ILD 22 is disposed on the patterned GE layer 17 and the gate insulation layer 16. The plurality of via holes 212 penetrate the ILD 22. The plurality of patterned source/drain electrodes 21 are connected to the two P$^+$-type layers 14 of the PMOS 82 and the two N$^+$-type layers 18 of the NMOS 81 through the plurality of via holes 212, respectively.

The patterned GE layer 17 is made out of a first metal. The patterned GE layer 17 comprises a vertical extension 172. The vertical extension 172 is connected to the $N^+$-type layer 18 which is connected to the first patterned poly-Si layer 121 through an opening 173, so as to form the TFT having the dual-gate structure.

Figure 1:
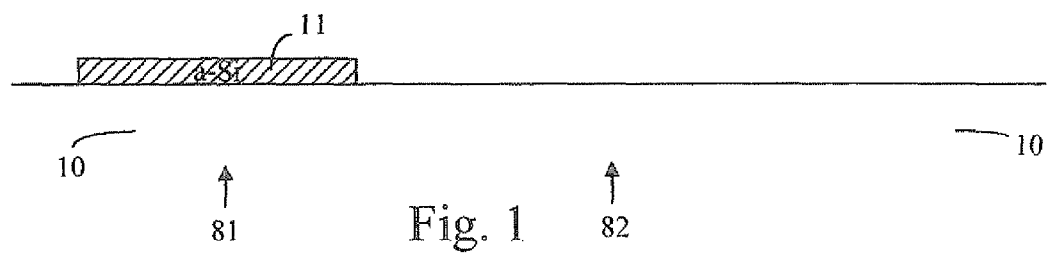
FIG. 1 is a diagram of an a-Si layer deposited on an array substrate according to a preferred embodiment of the present invention.

A method for forming an LTPS TFT having a dual-gate structure is proposed by another preferred embodiment of the present invention. The method comprises steps of:

Please refer to FIG. 1 showing Step 1 where an a-Si layer is deposited on an array substrate 10. A plurality of patterned a-Si layers 11 are formed after the process of exposure and the process of development. The plurality of patterned a-Si layers 11 are used as shielding layers.

Figure 2:
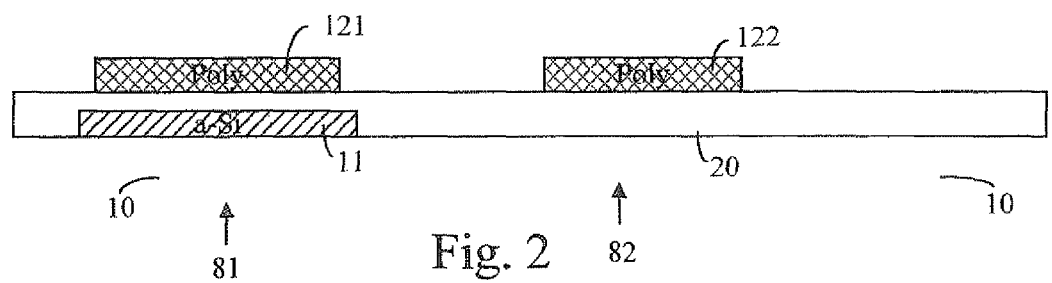
FIG. 2 is a diagram of a poly-Si layer formed according to the preferred embodiment of the present embodiment.

Refer to FIG. 2 showing Step 2 and Step 3. A barrier layer 20 is formed on each of the plurality of patterned a-Si layers 11 in Step 2. A first patterned poly-Si layer 121 and a second patterned poly-Si layer 122 are formed on the barrier layer 20 in Step 3. In this preferred embodiment, the barrier layer 20 is formed on each of the plurality of patterned a-Si layers 11 by means of chemical vapor deposition (CVD) with silicon nitride (SiNx) and silicon dioxide (SiOx). An additional a-Si layer is formed on the barrier layer 20. A first patterned poly-Si layer 121 and a second patterned poly-Si layer 122 are formed on an additional a-Si layer by means of excimer laser annealing (ELA).

Figure 3:
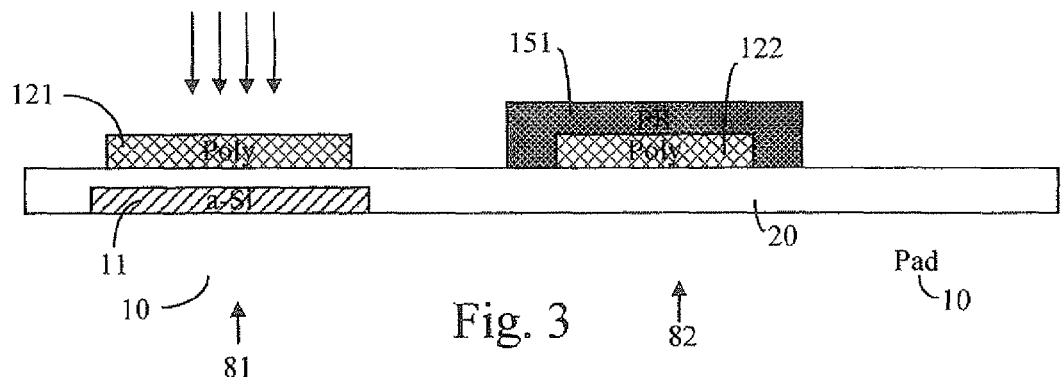
FIG. 3 is a diagram of doping an N-type channel of an NMOS according to the preferred embodiment of the present embodiment.

Please refer to FIG. 3 showing Step 4, Step 5, and Step 6. A first photoresist layer 151 is coated on the top surface and at the lateral side of the second patterned poly-Si layer 122 in Step 4. The first patterned poly-Si layer 121 is doped for forming an N-type channel in Step 5. The first photoresist layer 151 is removed from the second patterned poly-Si layer 122 in Step 6.

Figure 4:
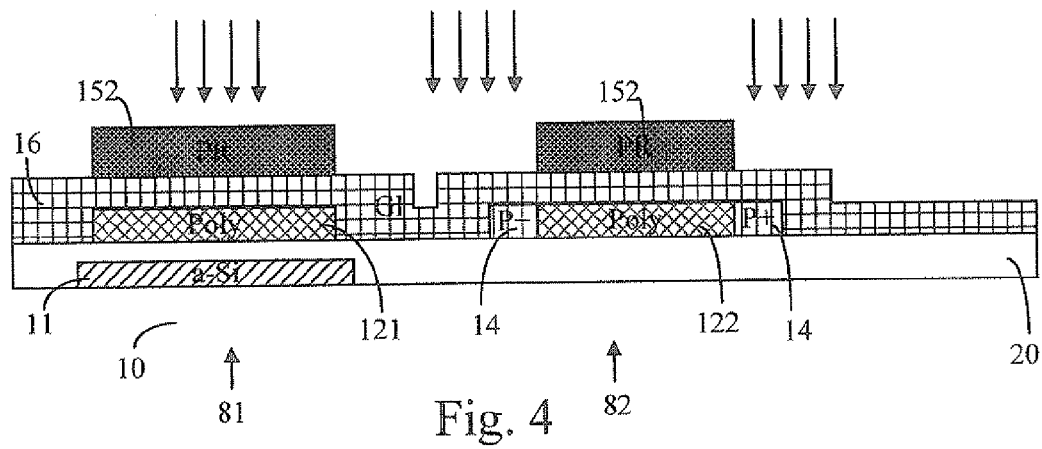
FIG. 4 is a diagram of a P$^+$ doping a poly-Si layer of a PMOS according to preferred embodiment of the the present embodiment.

Please refer to FIG. 4 showing Step 7 and Step 8. A gate insulation layer 16 is formed on both of the first patterned poly-Si layer 121 where the N-type channel is formed and the second patterned poly-Si layer 122 in Step 7. A second photoresist layer 152 is formed on the gate insulation layer 16. A $P^+$-type layer 14 is formed by $P^+$ doping the second patterned poly-Si layer 122 in Step 8. In this preferred embodiment, the gate insulation layer 16 is formed on both of the first patterned poly-Si layer 121 where the N-type channel is formed and the second patterned poly-Si layer 122 by means of CVD with SiNx and SiOx. Subsequently, the second photoresist layer 152 is coated on the gate insulation layer 16. The $P^+$-type layer 14 is formed by $P^+$ doping the second patterned poly-Si layer 122 after the process of exposure and the process of development. Subsequently, the second photoresist layer 152 is removed from the gate insulation layer 16.

Figure 5:
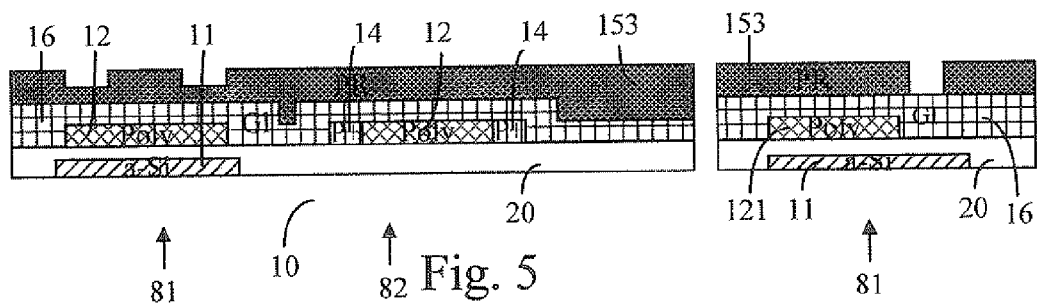
FIG. 5 is a diagram of the processes of exposing and developing a gate insulation layer on the top surface of the a-Si layer by using a half tone mask (HTM) according to the preferred embodiment of the present embodiment.
Figure 6:
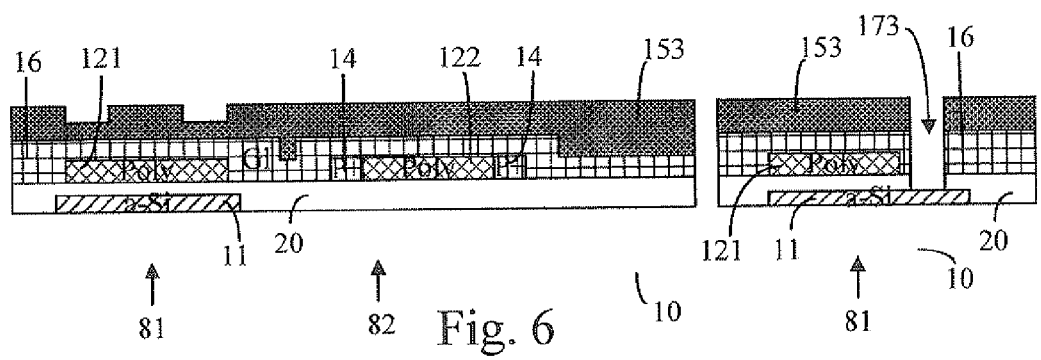
FIG. 6 is a diagram of N$^+$ doping an exposed part of the poly-Si layer and an exposed part of the a-Si layer according to the preferred embodiment of the present embodiment.

Please refer to FIG. 5 showing Step 9. The second photoresist layer 152 is removed from the gate insulation layer 16 and a third photoresist layer 153 is coated in the gate insulation layer 16 in Step 9. Please refer to FIG. 6 showing Step 10. A part of the third photoresist layer 153, a part of the gate insulation layer 16, and a part of the barrier layer 20 are removed after the process of exposure and the process of development for forming a plurality of openings 173 in Step 10. In this preferred embodiment, a part of the third photoresist layer 153 and a part of the gate insulation layer 16 disposed on the patterned a-Si layer 11 are removed after the process of exposure and the process of development via a half tone mask (HTM). Afterwards, a part of the barrier layer 20 is removed by means of dry etching.

Figure 7:
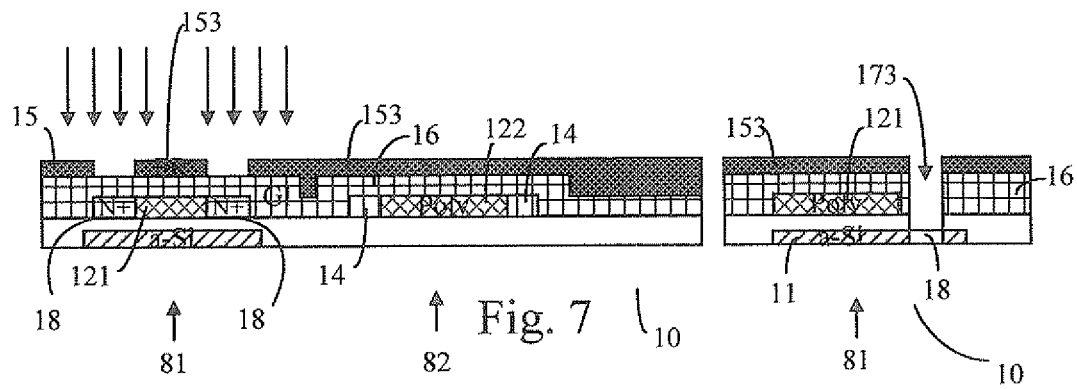
FIG. 7 is a diagram of a TFT having a dual-gate structure formed after the N$^+$-type layer connected to the a-Si layer is connected and conducted to a gate electrode (GE) layer above via a first metallic layer according to the preferred embodiment of the present embodiment.

Please refer to FIG. 7 showing Step 11. Both of a part of the patterned a-Si layer 11 and a part of the first patterned poly-Si layer 121 which are not covered by the gate insulation layer 16, undergoes $N^+$ doping to form an $N^+$-type layer 18 in Step 11.

Figure 8:
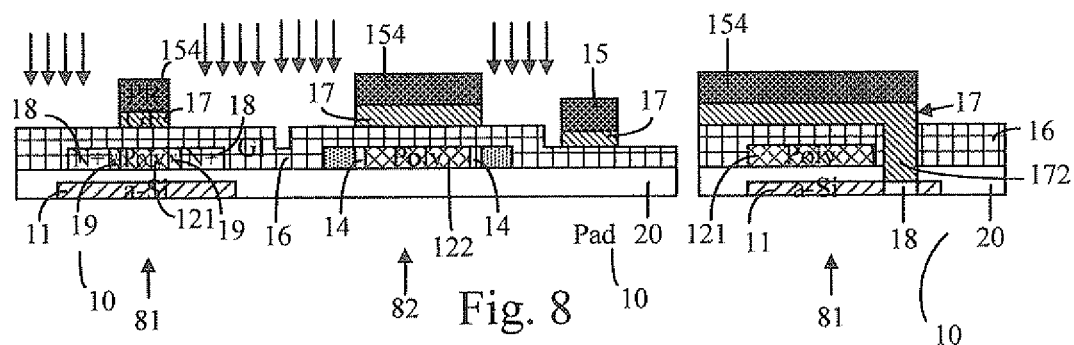
FIG. 8 is a diagram of forming a via hole penetrating an inter-level dielectric (ILD) and the gate insulation layer after silicon nitride (SiNx) and silicon dioxide (SiOx) are deposited by means of chemical vapor deposition (CVD), by using exposed and developed, and etched and removed according to the preferred embodiment of the present embodiment.

Please refer to FIG. 8 showing Step 12 and Step 13. The third photoresist layer 153 is removed, and a plurality of patterned GE layers 17 are formed on the gate insulation layer 16 in Step 12. In Step 13, the plurality of patterned GE layers 17 are used as a second shielding layer. An $N^-$-type layer 19 undergoes $N^+$ doping with the first patterned poly-Si layer 121 and the second patterned poly-Si layer 122, respectively. The plurality of patterned GE layers 17 corresponding to the first patterned poly-Si layer 121 is connected to and conducted to the $N^+$-type layer 18 of the patterned a-Si layer 11, which forms a dual-gate. In this preferred embodiment, a first metallic layer is deposited by means of physical vapor deposition (PVD). The plurality of patterned GE layers 17 are formed after the process of exposure and the process of development. The plurality of patterned GE layers 17 are used as another shielding layer. The $N^-$-type layer 19 is formed by $N^+$ doping the first patterned poly-Si layer 121 to form a light doping drain (LDD) structure. The $N^+$-type layer 18 connected to the patterned a-Si layer 11 (used as the bottom gate) is connected to and conducted to the patterned GE layer 17 above (used as the top gate) through the first metallic layer for forming a TFT having the dual-gate structure.

Please refer to FIG. 9 showing Step 14, Step 15, and Step 16. The ILD 22 is formed on the plurality of patterned GE layers 17 and the gate insulation layer 16 in Step 14. A plurality of via holes 212 penetrate the ILD 22 and the gate insulation layer 16 in Step 15. In Step 16, a plurality of patterned source/drain electrodes 21 are formed through the plurality of via holes 212. The plurality of patterned source/drain electrodes 21 are connected to the $P^+$-type layer 14 which is connected to the second patterned poly-Si layer 122, to form the PMOS 82. In addition, the plurality of patterned source/drain electrodes 21 are connected to the $N^+$-type layer 18 which is connected to the first patterned poly-Si layer 121, to form the NMOS 81. In this preferred embodiment, the ILD 22 is formed on the plurality of patterned GE layers 17 and the gate insulation layer 16 by means of chemical vapor deposition (CVD) with silicon nitride (SiNx) and silicon dioxide (SiOx). Then, the ILD 22 is exposed and developed and etched and removed. At last, the plurality of via holes 212 penetrate the ILD 22 and the gate insulation layer 16. A second metallic layer is deposited by means of physical vapor deposition (PVD). Then, the second metallic layer is etched after being exposed and developed for forming the plurality of patterned source/drain electrodes 21. The plurality of patterned source/drain electrodes 21 are connected to the $P^+$-type layer 14 of the PMOS 82 and the $N^+$-type layer 18 of the NMOS 81 through the plurality of via holes 212, respectively.

The $N^+$-type layer 18 undergoes $N^+$ doping with the exposed part of the patterned a-Si layer 11 is used for forming a better ohmic contact with the metallic electrode. The patterned a-Si layer 11 is added to the structure and the method introduced in the embodiments of the present invention. The patterned a-Si layer 11 can be used as not only a shielding layer but also a bottom gate of the TFT having the dual-gate structure. When the patterned a-Si layer 11 is used as a bottom gate, reliability of the TFT enhances, the conducted current increases, driving ability improves, and power consumption decreases. In addition, the doping of a conventional LDD can be done through a single one mask, which may cost a larger amount of money. Or, the doping of a conventional LDD can be realized after gate over wet etching, which may affect the yield rate. Instead, the gate provided by the present embodiment of the present invention can be used as a shielding layer directly and can be doped with the LDD. In other words, the present embodiment of the present invention does not have the same problem occurring in the conventional technology when the two conventional methods are adopted.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A method for forming an LTPS TFT having a dual-gate structure, comprising:

forming a plurality of patterned a-Si layers disposed on a substrate;

forming a barrier layer on the plurality of patterned a-Si layers;

forming a first patterned poly-Si layer and a second patterned poly-Si layer on the barrier layer;

coating a first photoresist layer on a top surface of the second patterned poly-Si layer and surrounding the second patterned poly-Si layer;

forming an N-type channel by doping the first patterned poly-Si layer;

removing the first photoresist layer from the second patterned poly-Si layer;

forming a gate insulation layer on both of the second patterned poly-Si layer and the first patterned poly-Si layer where the N-type channel is formed;

forming a second photoresist layer on the gate insulation layer, and doping the second patterned poly-Si layer to form a $P^+$-type layer;

removing the second photoresist layer from the gate insulation layer, and coating a third photoresist layer on the gate insulation layer;

removing a part of the third photoresist layer, a part of the gate insulation layer, and a part of the barrier layer by performing exposing and developing processes, for forming a plurality of openings;

$N^+$ doping a part of the patterned a-Si layer and a part of the first patterned poly-Si layer which are not covered by the gate insulation layer;

forming a plurality of patterned GE layers on the gate insulation layer;

$N^-$ doping the first patterned poly-Si layer and the second patterned poly-Si layer with the plurality of patterned GE layers as a second shielding layer, the plurality of patterned GE layers corresponding to the first patterned poly-Si layer connected to and conducted to the $N^+$-type layer of the patterned a-Si layer, and the plurality of patterned GE layers and the $N^+$-type layer forming a dual-gate structure;

forming an ILD on the plurality of patterned GE layers and the gate insulation layer;

forming a plurality of via holes penetrating the ILD and the gate insulation layer; and forming a plurality of patterned source/drain electrodes through the plurality of via holes, the plurality of patterned source/drain electrodes connected to the $P^+$-type layer which is connected to the second patterned poly-Si layer to for a PMOS, and the plurality of patterned source/drain electrodes connected to the $N^+$-type layer which is connected to the first patterned poly-Si layer to form an NMOS.

2. The method as claimed in claim 1, wherein the $N^+$-type layer is doped with the exposed part of the patterned a-Si layer for forming an ohmic contact with a metallic electrode.

* * * * *